US 7,778,044 B2

(12) United States Patent
Inaba et al.

(10) Patent No.: US 7,778,044 B2
(45) Date of Patent: Aug. 17, 2010

(54) TUNER MODULE FOR RADIO RECEIVER

(75) Inventors: Toshihiko Inaba, Akita (JP); Takumi Suzuki, Akita (JP); Kyuichi Sato, Akita (JP)

(73) Assignee: Mitsumi Electric Co., Ltd., Tama-Shi (JP)

( * ) Notice: Subject to any disclaimer, the term of this patent is extended or adjusted under 35 U.S.C. 154(b) by 248 days.

(21) Appl. No.: 11/646,741

(22) Filed: Dec. 28, 2006

(65) Prior Publication Data

US 2007/0178873 A1      Aug. 2, 2007

(30) Foreign Application Priority Data

Jan. 18, 2006   (JP)  .............................. 2006-009954

(51) Int. Cl.
*H05K 7/20*     (2006.01)
(52) U.S. Cl. ........................ 361/814; 361/752; 361/702; 361/715; 174/520
(58) Field of Classification Search ................. 361/814, 361/800, 816, 818, 706, 752, 702, 707, 711, 361/714, 715; 174/520
See application file for complete search history.

(56) References Cited

U.S. PATENT DOCUMENTS

| | | | | |
|---|---|---|---|---|
| 5,956,576 A | * | 9/1999 | Toy et al. | 438/125 |
| 6,365,964 B1 | * | 4/2002 | Koors et al. | 257/718 |
| 6,570,086 B1 | * | 5/2003 | Shimoji et al. | 174/377 |
| 6,724,631 B2 | * | 4/2004 | Ye et al. | 361/719 |
| 6,744,640 B2 | * | 6/2004 | Reis et al. | 361/818 |
| 7,023,699 B2 | * | 4/2006 | Glovatsky et al. | 361/704 |
| 7,095,615 B2 | * | 8/2006 | Nichols | 361/719 |

FOREIGN PATENT DOCUMENTS

| | | |
|---|---|---|
| JP | 06-209268 A | 7/1994 |
| JP | 2002-344335 A | 11/2002 |

* cited by examiner

*Primary Examiner*—Dameon E Levi
(74) *Attorney, Agent, or Firm*—Frishauf, Holtz, Goodman & Chick, P.C.

(57) ABSTRACT

The present invention is applied to a tuner module comprising a circuit as a constituent component for tuning at the time of radio signal reception and a metal case made of aluminum and receiving the circuit. The circuit includes at least one IC component. In the metal case, a heat conductive sheet is attached between the at least one IC component and the metal case so as to be in contact with them. Furthermore, a heat radiating sheet is attached to an outer surface of the metal case.

13 Claims, 4 Drawing Sheets

TUNER MODULE FOR RADIO RECEIVER

This application claims priority to prior Japanese application JP 2006-9954, the disclosure of which is incorporated herein by reference.

BACKGROUND OF THE INVENTION

This invention relates to a tuner module for a radio receiver and, in particular, relates to a tuner module suitable for an automobile digital radio receiver capable of listening to digital radio broadcasting by receiving radiowaves from an artificial satellite (hereinafter referred to as "satellite waves") or radiowaves on the ground (hereinafter referred to as "ground waves").

Recently, digital radio receivers capable of listening to digital radio broadcasting by receiving satellite waves or ground waves have been developed and put to practical use in the U.S. The digital radio receiver is generally mounted in a mobile body such as an automobile and is capable of listening to radio broadcasting by receiving radiowaves with frequencies in about 2.3 GHz band. That is, the digital radio receiver is a radio receiver capable of listening to mobile broadcasting. Since the frequency of the received radiowave is in about 2.3 GHz band, the received wavelength (resonant wavelength) λ is about 128.3 mm. The ground wave is a radiowave obtained by once receiving a satellite wave at an earth station, slightly shifting it in frequency, and then retransmitting it as a linearly polarized wave. That is, the satellite wave is a circularly polarized wave, while the ground wave is a linearly polarized wave.

As digital radio receivers, there are not only the type adapted to be mounted in an automobile, but also a type adapted to be installed in a house or the like, and further a type that is portable using a battery as a power source.

In any case, since the radiowaves having the frequencies in about 2.3 GHz band are used in the digital radio broadcasting, received signals are input into a tuner through an antenna device receiving the radiowaves. Normally, components constituting the tuner are mounted on a printed wiring board and placed in a metal case also serving as a shield (see, e.g. Japanese Unexamined Patent Application Publication (JP-A) No. H06-209268).

The structure of a satellite digital radio receiver will be explained as one example with reference to FIG. 1. In FIG. 1, the satellite digital radio receiver comprises an antenna 101, a tuner section 102, a signal demodulation section 103, a channel demodulation section 104, a sound decoder 105, a data decoder 106, a control section 107, and an operating section 108 (see, e.g. Japanese Unexamined Patent Application Publication (JP-A) No. 2002-344335).

In the meantime, the components constituting the tuner include IC components. The IC components of this type often require means for radiating heat generated therefrom. This is because if the heat radiation from the IC components is insufficient so that the IC components are raised to a high temperature, it may cause deterioration in reception state. A heatsink is often used as the heat radiating means for the IC components. The heatsink is often a combination of structures having cooling fins, which, however, increases in overall size and thus is not suitable particularly for the case where miniaturization is required.

SUMMARY OF THE INVENTION

It is therefore an object of this invention to provide a tuner module that can realize excellent heat radiation of an IC component without increasing the overall size of the tuner module including the IC component.

The present invention is applied to a tuner module comprising a circuit as a constituent component for tuning at the time of radio signal reception and a metal case made of aluminum and receiving the circuit. The circuit includes at least one IC component.

According to an aspect of the present invention, in the metal case, a heat conductive sheet is attached between the at least one IC component and the metal case so as to be in contact with them, and a heat radiating sheet is attached to an outer surface of the metal case.

In the tuner module according to the aspect of the present invention, the constituent component comprises a printed wiring board and a first and a second IC component mounted on both sides of the printed wiring board, respectively. The first and second IC components include the at least one IC component. In this case, it is preferable that, in the metal case, a first heat conductive sheet is attached between the first IC component and the metal case so as to be in contact with them and a second heat conductive sheet is attached between the second IC component and the metal case so as to be in contact with them.

In the tuner module according to the aspect of the present invention, it is preferable that a first and a second heat radiating sheet are respectively attached to the outer surfaces of the metal case in regions including bonding regions of the first and second heat conductive sheets.

In the tuner module according to the aspect of the present invention, it is preferable that the heat conductive sheet is made of silicone rubber.

In the tuner module according to the aspect of the present invention, it is preferable that the metal case comprises aluminum-diecast upper and lower cases.

According to another aspect of the present invention, an automobile digital radio receiver incorporating the above-mentioned tuner module is provided.

According to this invention, since heat radiation of the IC components in the tuner module can be improved by a thin heat conductive sheet and a thin heat radiating sheet, deterioration in reception state of the radio receiver due to temperature rise can be prevented without increasing the size of the tuner module.

DESCRIPTION OF THE PREFERRED EMBODIMENT

Figure 1:
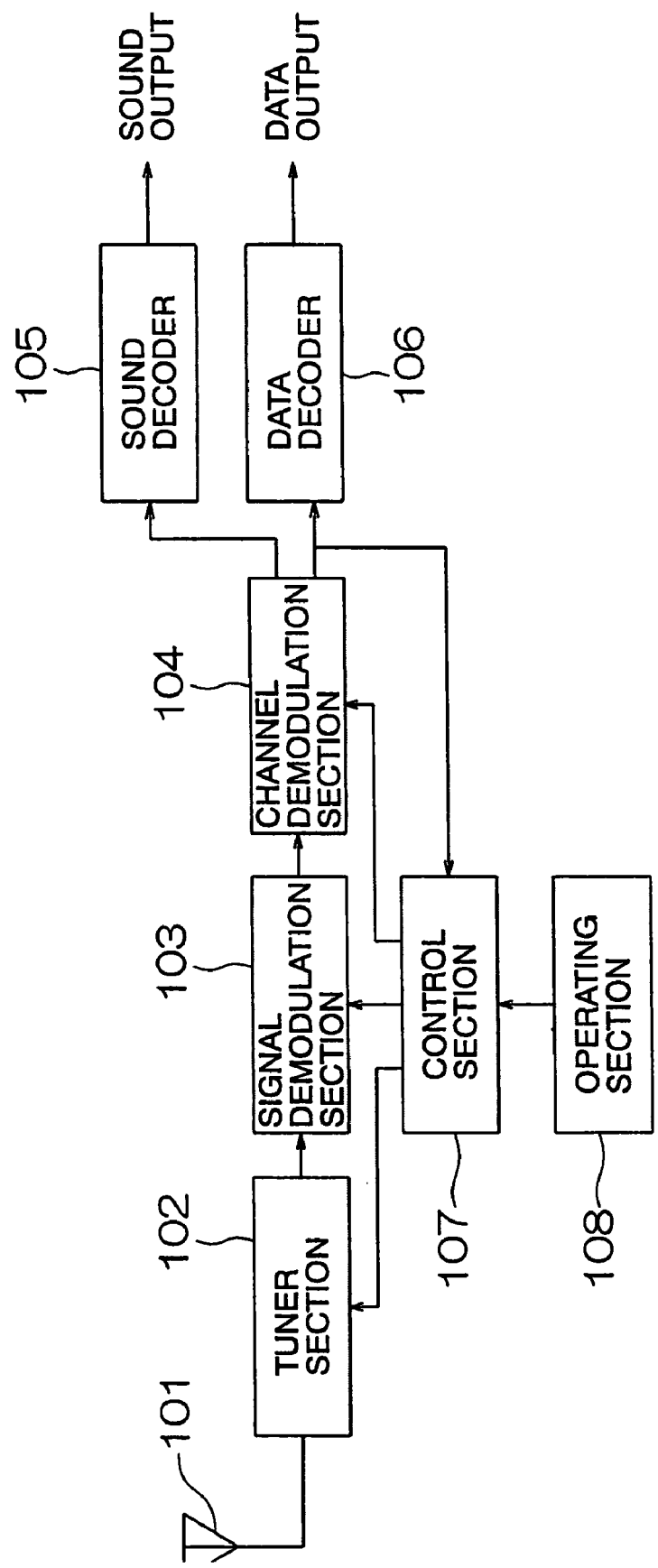
FIG. 1 is a block diagram showing the structure of a satellite digital radio receiver as one example of a conventional digital radio receiver.

Now, referring to the drawings, an embodiment of this invention will be described in detail. Hereinbelow, description will be given of a case where this invention is applied particularly to an automobile digital radio receiver among satellite digital radio receivers, one example of which was explained with reference to FIG. 1.

Figure 2:
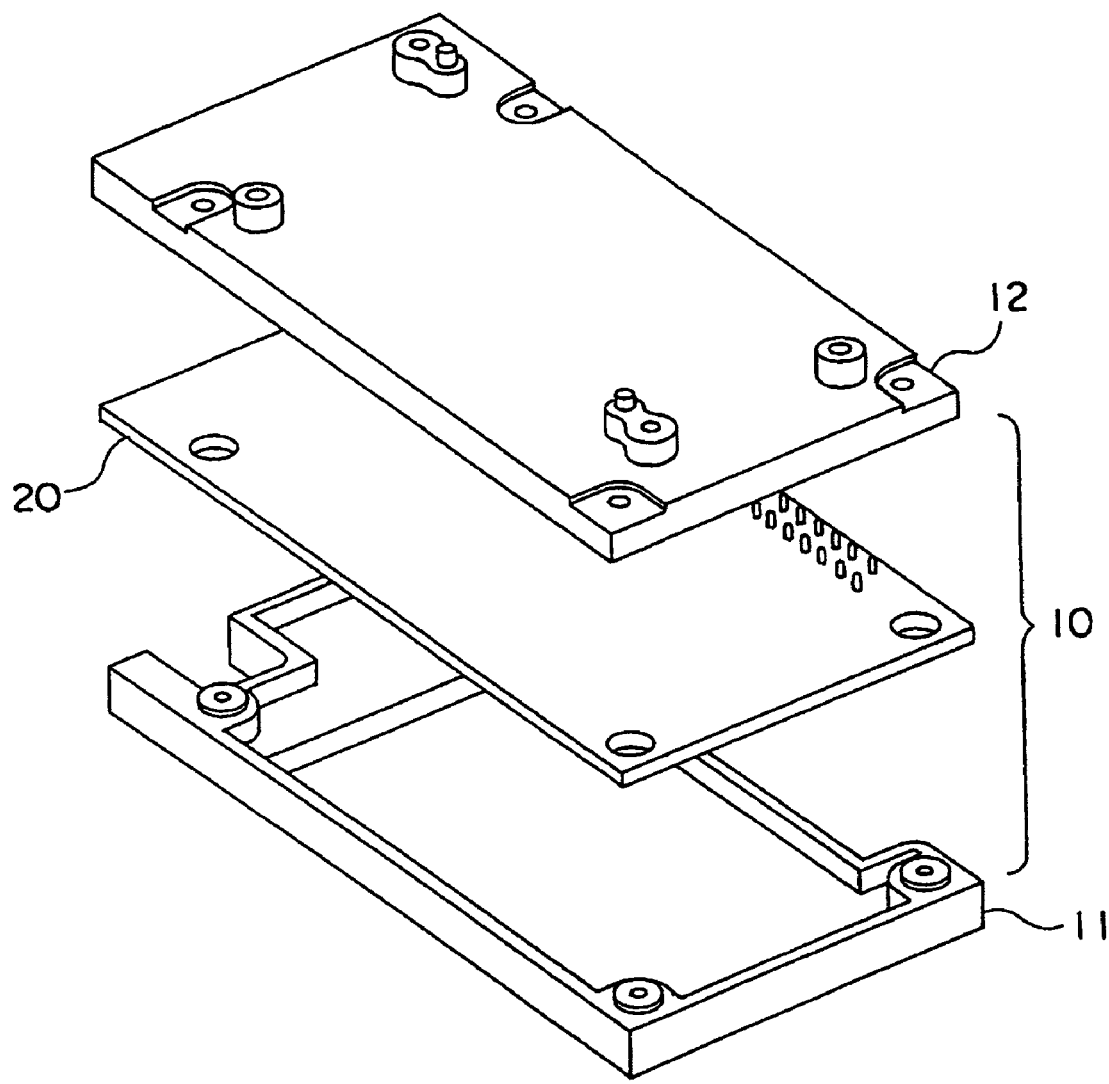
FIG. 2 is a perspective view showing a schematic structure of a tuner module in an automobile digital radio receiver to be applied with this invention.
Figure 3A:
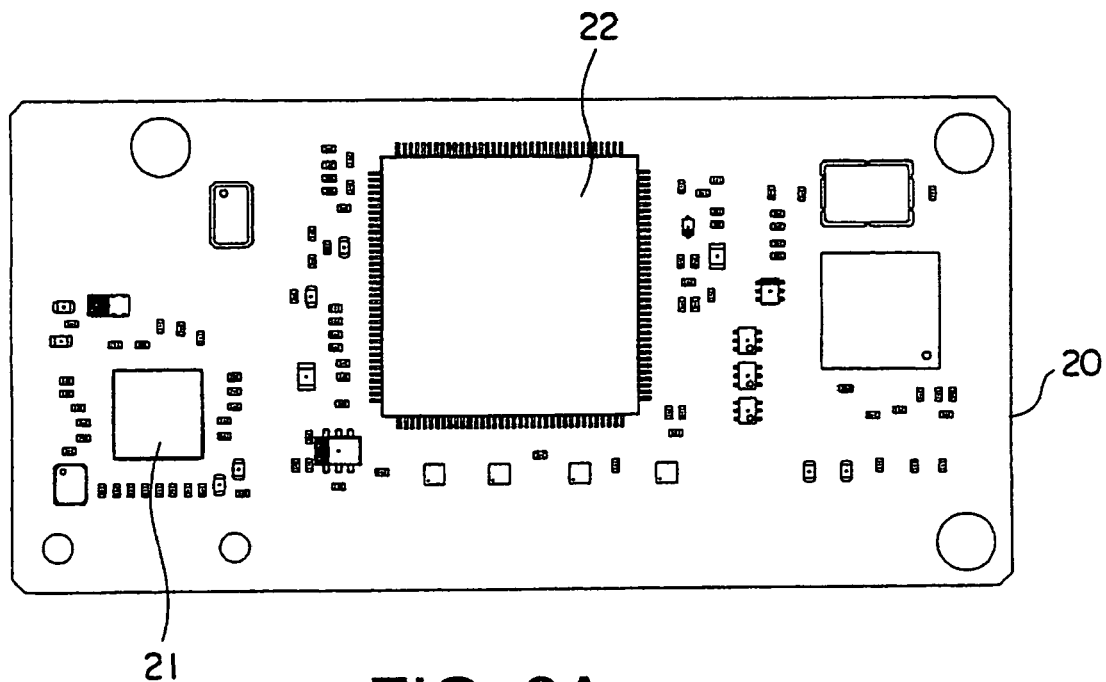
FIGS. 3A and 3B are diagrams as seen from the top and bottom sides of a printed wiring board mounted with circuit components constituting the tuner module shown in FIG. 2.
Figure 3B:
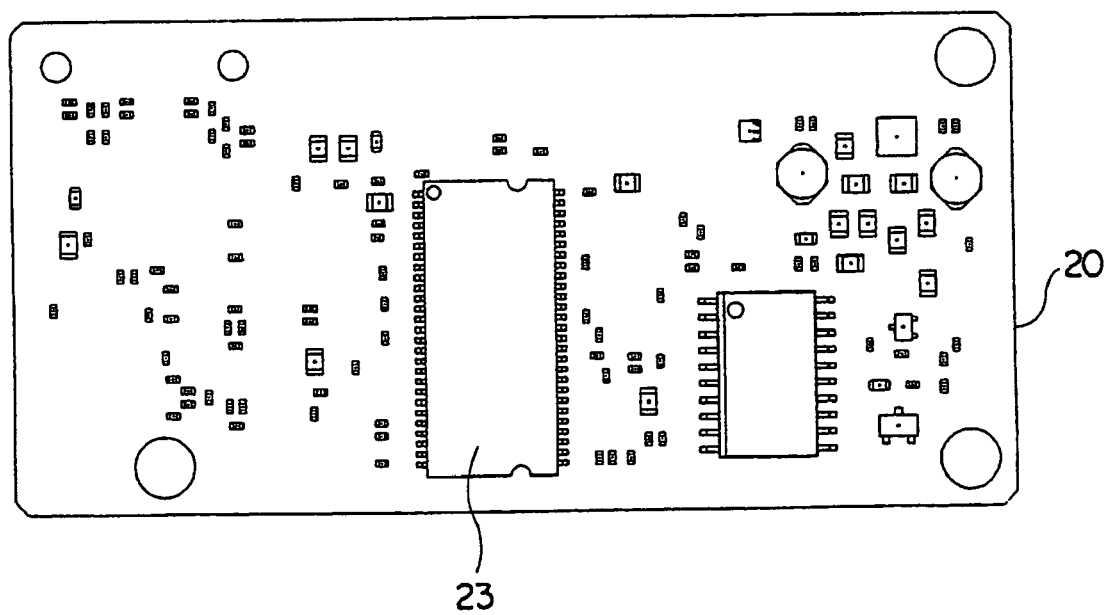

FIGS. 2, 3A, and 3B show the case where, among constituent components of the automobile digital radio receiver, a tuner section, a demodulation section, a sound decoder section, a data decoder section, and a controller for controlling them are mounted on a single printed wiring board 20, and this printed wiring board 20 is placed in a metal case 10. Herein, this structure is called a tuner module.

FIG. 2 shows the metal case 10 with its top and bottom reversed. In FIG. 2, the metal case 10 comprises aluminum-diecast upper and lower cases 11 and 12. The printed wiring board 20 is placed in a space between the upper and lower cases 11 and 12, except its portions necessary for electrical connection to the exterior, so as to be shielded.

In FIGS. 3A and 3B, the printed wiring board 20 is mounted with electronic components on its top and bottom sides. FIG. 3A shows the top side of the printed wiring board 20, while FIG. 3B shows the bottom side thereof. A first IC component 21 serving as a main constituent component of the tuner section and a second IC component 22 serving as a main constituent component of the demodulation section are mounted on the top side of the printed wiring board 20. A third IC component 23 serving as a main constituent component of the controller is mounted on the bottom side of the printed wiring board 20. The number and layout of IC components as described above is only one example and there are various other types and modifications thereof.

Although not shown in detail in FIG. 2, the inner sides of the upper case 11 and the lower case 12 are respectively formed with recessed portions each corresponding to a size of the electronic component or a size of a group of the electronic components (in the case where the plurality of electronic components are arranged adjacent to each other) mounted on the printed wiring board 20. This is for minimizing the thickness of the tuner module. Naturally, conductor patterns formed on the printed wiring board 20 and those components that raise a problem if shorted are prevented from contacting the metal case 10 or insulated.

Figure 4:
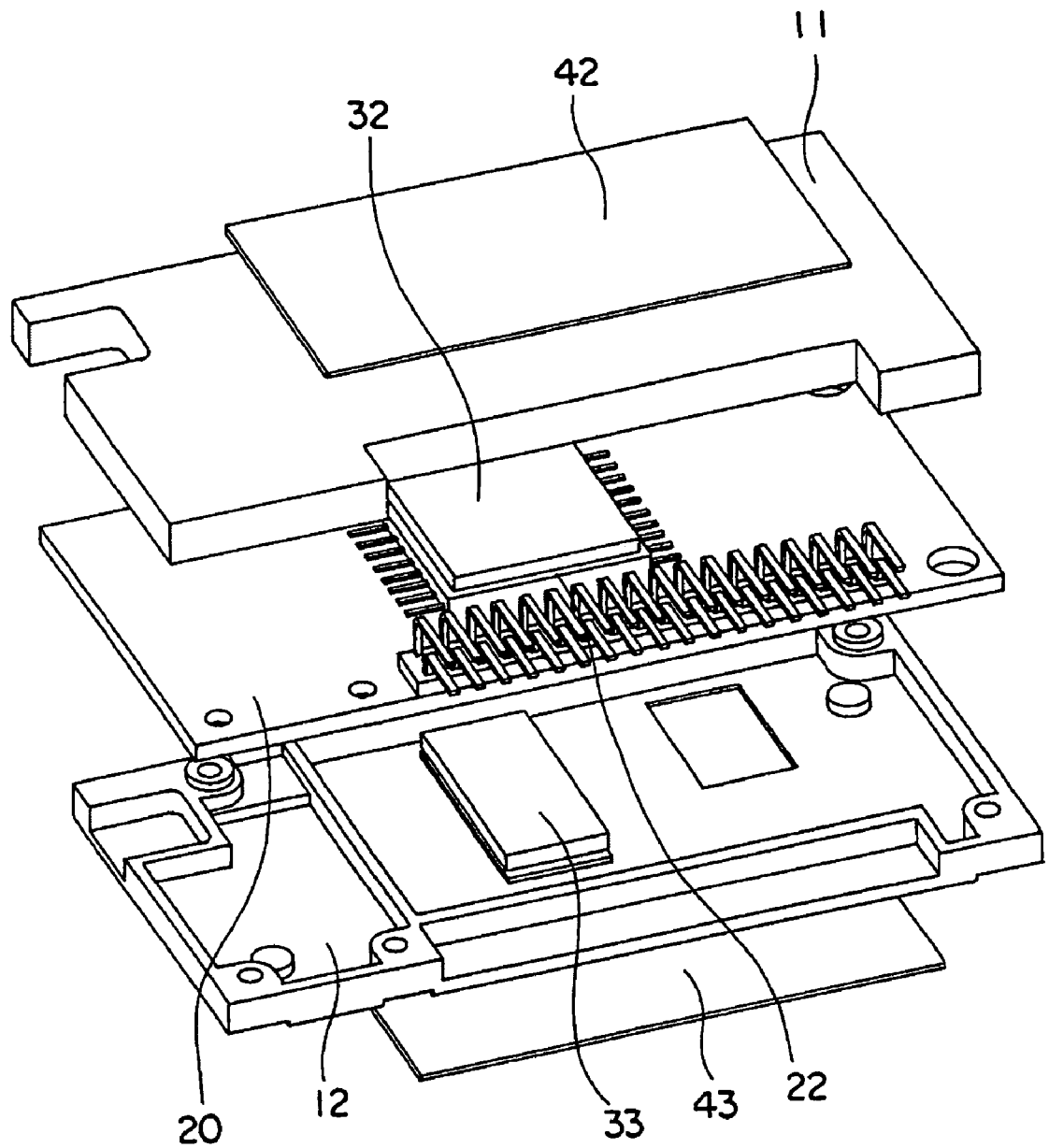
FIG. 4 is a perspective view showing a schematic structure of the tuner module shown in FIG. 2, in the state where this invention is applied thereto.

FIG. 4 shows an embodiment in which this invention is applied to the tuner module shown in FIGS. 2, 3A, and 3B. In this embodiment, heat conductive sheets 32 and 33 are bonded to the top surfaces (herein, the whole top surfaces) of the second and third IC components 22 and 23 among the first to third IC components 21 to 23 or to the inner surfaces of the metal case 10 (upper and lower cases 11 and 12) corresponding thereto. For achieving better heat conduction, the heat conductive sheets 32 and 33 are placed in tight surface contact with the second IC component 22 and the inner surface of the upper case 11 and with the third IC component 23 and the inner surface of the lower case 12, respectively. As a material of the heat conductive sheets, there is cited, for example, silicone rubber, acrylic rubber, graphite, or the like.

On the other hand, on the outer surfaces of the metal case 20, i.e. on the other surfaces of the upper case 11 and the lower case 12, heat radiating sheets 42 and 43 are respectively bonded to regions including those regions corresponding to the heat conductive sheets 32 and 33. The bonding regions of the heat radiating sheets 42 and 43 preferably include the bonding regions of the heat conductive sheets 32 and 33, but may be offset from the bonding regions of the heat conductive sheets 32 and 33. As a material of the heat radiating sheets, there is cited, for example, a mixture of liquid ceramic and glass cloth, or the like.

According to the structure as described above, since the heat conductive sheets and the heat radiating sheets are both thin, the tuner module is prevented from increasing in overall size, particularly in size in its thickness direction. Further, heat generated at the second and third IC components 22 and 23 is efficiently transferred to the upper case 11 and the lower case 12 through the heat conductive sheets 32 and 33. As described above, the upper case 11 and the lower case 12 are formed by aluminum die casting and thus have a high heat conductivity, i.e. being excellent in heat radiation effect. In addition, the heat radiating sheets 42 and 43 are bonded to the outer surfaces of the upper case 11 and the lower case 12, thereby further improving the heat radiation performance. According to a heat radiation performance test, a temperature drop of about 10° C. was confirmed in this embodiment as compared with the case of using neither the heat conductive sheets nor the heat radiating sheets. Further, it has been confirmed that the tuner module of this embodiment normally operates even in a performance test under an atmosphere of 85° C.

While this invention has been described in terms of the preferred embodiment, the invention is not to be limited thereto. For example, in the foregoing embodiment, the printed wiring board is placed in the metal case composed of the upper case and the lower case. However, even in a case where a tuner module is composed of an upper case (or a lower case) and a printed wiring board, it is possible, by applying this invention, to realize a structure that promotes heat radiation from IC components mounted on the printed wiring board on its side facing the upper case (or the lower case).

This invention is particularly suitable for a tuner module in an automobile digital radio receiver requiring miniaturization, but is of course applicable to the whole range of radio receivers that require heat radiation because of using IC components.

What is claimed is:

1. A tuner module comprising:
   a circuit which is a constituent component for tuning at a time of radio signal reception, and
   a metal case which is made of aluminum and which receives said circuit,
   wherein said circuit includes at least one IC component,
   wherein, in said metal case, a heat conductive sheet is provided between said at least one IC component and said metal case so as to be in contact with said at least one IC component and said metal case,
   wherein a heat radiating sheet is attached to an outer surface of said metal case in a region at least partially corresponding to a bonding region of said heat conductive sheet,
   wherein said circuit comprises a printed wiring board, and comprises, as the at least one IC component, a first IC component and a second IC component respectively mounted on both sides of said printed wiring board,
   wherein said metal case comprises aluminum-diecast upper and lower cases, and
   wherein said printed wiring board is sandwiched between said upper and lower cases such that said printed wiring board is provided in a space between said upper and lower cases, except for portions of the printed wiring board necessary for electrical connection to outside of the metal case.

2. The tuner module according to claim 1, wherein, in said metal case, a first heat conductive sheet is provided between said first IC component and said metal case so as to be in contact with said first IC component and said metal case, and a second heat conductive sheet is provided between said second IC component and said metal case so as to be in contact with said second IC component and said metal case.

3. The tuner module according to claim 2, wherein a first heat radiating sheet and a second heat radiating sheet are respectively attached to outer surfaces of said metal case in regions at least partially corresponding to bonding regions of said first and second heat conductive sheets.

4. The tuner module according to claim 1, wherein said heat conductive sheet is made of silicone rubber.

5. An automobile digital radio receiver incorporating the tuner module according to claim 1.

6. The tuner module according to claim 1, wherein said heat conductive sheet is bonded to said at least one IC component so as to be provided between and in contact with said at least one IC component and said metal case.

7. The tuner module according to claim 1, wherein said heat conductive sheet is bonded to an inner surface of said metal case so as to be provided between and in contact with said at least one IC component and said metal case.

8. The tuner module according to claim 1, wherein the heat conductive sheet is made of one of acrylic rubber and graphite.

9. The tuner module according to claim 1, wherein the heat radiating sheet is made of a mixture of liquid ceramic and glass cloth.

10. The tuner module according to claim 1, wherein the heat conductive sheet and the heat radiating sheet are provided so as to be at least partially overlapped in a thickness direction of the tuner module.

11. The tuner module according to claim 10, wherein the heat conductive sheet and the heat radiating sheet are provided so as to be substantially parallel to a longitudinal axis of the circuit.

12. The tuner module according to claim 3, wherein the first IC component, the first heat conductive sheet and the first heat radiating sheet are provided so as to be at least partially overlapped in a thickness direction of the tuner module.

13. The tuner module according to claim 12, wherein the first IC component, the first heat conductive sheet and the first heat radiating sheet are provided so as to be substantially parallel to a longitudinal axis of the circuit.

* * * * *